United States Patent
Mallinson

(10) Patent No.: US 10,637,496 B2
(45) Date of Patent: Apr. 28, 2020

(54) LOW NOISE QUANTIZED FEEDBACK CONFIGURATION

(71) Applicant: SiliconIntervention Inc., Kelowna (CA)

(72) Inventor: A. Martin Mallinson, Kelowna (CA)

(73) Assignee: SiliconIntervention Inc., Kelowna (CA)

( * ) Notice: Subject to any disclaimer, the term of this patent is extended or adjusted under 35 U.S.C. 154(b) by 0 days.

(21) Appl. No.: 16/454,010

(22) Filed: Jun. 26, 2019

(65) Prior Publication Data

US 2020/0007146 A1    Jan. 2, 2020

Related U.S. Application Data

(60) Provisional application No. 62/691,504, filed on Jun. 28, 2018.

(51) Int. Cl.
| | |
|---|---|
| *H03M 3/00* | (2006.01) |
| *H03M 1/10* | (2006.01) |
| *H04B 1/00* | (2006.01) |
| *H04B 1/10* | (2006.01) |
| *H04L 25/06* | (2006.01) |

(52) U.S. Cl.
CPC ............ *H03M 3/39* (2013.01); *H03M 1/1057* (2013.01); *H03M 3/30* (2013.01); *H04B 1/0017* (2013.01); *H04B 1/1027* (2013.01); *H04L 25/061* (2013.01)

(58) Field of Classification Search
CPC .... H03M 3/30; H03M 1/1057; H04B 1/0017; H04B 1/1027; H04L 25/061
USPC .................. 341/143, 121; 375/350, 287, 227
See application file for complete search history.

(56) References Cited

U.S. PATENT DOCUMENTS 5,699,386 A * 12/1997 Measor ................ H04L 25/061
375/286

OTHER PUBLICATIONS

M. P. van Alphen, R. E. J. van de Grift, J. M. Pieper and R. J. van de Plassche, "The PM 2517 automatic digital multimeter", Philips Technical Review, vol. 38, 1978/79 No. 7/8 (http://www.extra.research.philips.com/hera/people/aarts/_Philips%20Bound%20Archive/PTechReview/PTechReview-38-1978_79-181.pdf).

* cited by examiner

*Primary Examiner* — Joseph J Lauture
(74) *Attorney, Agent, or Firm* — Gard & Kaslow LLP

(57) ABSTRACT

Described herein is an improved apparatus for increasing the performance of a ΣΔ modulator, which may function as an ADC. In one embodiment, the ΣΔ modulator comprises a voltage to current converter, a capacitor connected between two outputs of the voltage to current converter to receive a differential input current, and a switch that can switch between connecting each output of the voltage to current converter to ground while disconnecting the other output of the voltage to current converter. In this embodiment, the ΣΔ modulator has no common mode control loop, and no reference current. This results in decreased complexity, i.e., fewer components, as well as reduced noise.

6 Claims, 5 Drawing Sheets

LOW NOISE QUANTIZED FEEDBACK CONFIGURATION

This application claims priority from Provisional Application No. 62/691,504, filed Jun. 28, 2018, which is incorporated by reference herein in its entirety.

FIELD OF THE INVENTION

The present invention relates generally to sigma-delta modulators, and more particularly to sigma-delta modulators without common mode control loops.

BACKGROUND OF THE INVENTION

Quantized feedback may be used in control loops to perform analog to digital conversion. Analog to digital converters (ADCs) with such features are often known as sigma-delta ($\Sigma\Delta$) converters, or $\Sigma\Delta$ modulators, the modulator term referring to an output digital data stream having a certain symbol pattern, or modulation, imposed upon it by the control loop. The terms $\Sigma\Delta$ modulator and noise shaping control loop are often used interchangeably in the art, although the latter is more descriptive. Circuit designers often like to use such $\Sigma\Delta$ modulators as in many cases they may be simpler to design and cheaper to make than other types of ADCs.

In such a noise shaping control loop, a continuous analog signal is applied at the input, and a digital pattern representative of this signal emerges from the output. The digital signal is created by one or more quantization elements in the control loop, for example, by non-linear elements in the loop such as flip-flops or comparators that have a discrete set of non-continuous output values for any given continuous input quantity.

The $\Sigma\Delta$ modulation works by constraining a feedback parameter to one of a set of at least two specific values, and a control loop of arbitrary order ensures that the average feedback value equals the input. Instantaneous deviations from the ideal continuous feedback necessarily introduced by quantization elements represent noise, and a sophisticated, possibly high order, control loop can suppress or "shape" this noise. To "shape" the noise means to filter it, generally to make it not appear in certain frequency bands. The loop therefore operates to suppress this noise in certain frequency bands of interest, often at the expense of increased noise in bands that are not relevant to the application. Hence $\Sigma\Delta$ modulators are sometimes also referred to a "noise shaping loops."

In some $\Sigma\Delta$ modulators the input parameter is a current (or a difference in currents), in part of the circuit, and two or more currents (or difference currents) are generated to provide feedback. FIG. 1 shows an example of a circuit 100 of the prior art, in which an input difference current is made to flow in the drains of transistors M1 and M2. In this case, the "common mode current" must be balanced, i.e., the sum of the currents through the drains of M1 and M2 must equal the sum of the currents in current sources I3, I4 and I5.

The common mode control portion of the circuit 100, i.e., the components below transistors M1 and M2, adds complexity and cost. Further, whenever a circuit operates by nulling out the difference of two quantities, as in circuit 100, it is only the nominal value of those quantities that are caused to be equal; if the quantities have associated noise, that noise is not cancelled, but rather remains in the difference of the two quantities as the root-sum-square of the individual noise components.

For these reasons, a simple and inexpensive way of improving the performance of $\Sigma\Delta$ modulators by eliminating any common mode control may be useful.

SUMMARY OF THE INVENTION

The present application describes an apparatus and method for improving the performance of $\Sigma\Delta$ modulators.

One embodiment describes an apparatus, comprising: a voltage to current converter comprising: first and second transistors, each transistor having a gate, a source and a drain; an input signal source connected between the gates of the first and second transistors and providing an input signal; a resistor connected between the sources of the first and second transistors; a first current source connected to the source of the first transistor and to a power supply; a second current source connected to the source of the second transistor and to a power supply; wherein there is a difference between current from the drain of the first transistor and current from the drain of the second transistor, the difference between the currents representing the input signal; a capacitor connected between the drain of the first transistor and the drain of the second transistor; a switch connected to the drains of the first and second transistors and having two positions, a first position connecting the drain of the first transistor to a ground and leaving the drain of the second transistor unconnected to the ground, and a second position connecting the drain of the second transistor to the ground and leaving the drain of the first transistor unconnected to the ground; and a control circuit that measures voltage across the capacitor and causes the switch to change between the two positions to maintain an average value of charge on the capacitor at zero.

Another embodiment describes an apparatus, comprising: a voltage to current converter comprising: first and second transistors, each transistor having a gate, a source and a drain; an input signal source connected between the gates of the first and second transistors; a resistor connected between the sources of the first and second transistors; a first current source connected to the source of the first transistor and to a power supply; a second current source connected to the source of the second transistor and to a power supply; wherein there is a difference between current from the drain of the first transistor and current from the drain of the second transistor, the difference between the currents representing the input signal; a capacitor connected between the drain of the first transistor and the drain of the second transistor; a third transistor having a gate, a source and a drain, the source and gate connected to the drain of the first transistor; a fourth transistor having a gate, a source and a drain, the source connected to the drain of the first transistor; a fifth transistor having a gate, a source and a drain, the source and gate connected to the drain of the second transistor and to the gate of the fourth transistor; a sixth transistor having a gate, a source and a drain, the source connected to the drain of the first transistor and to the gate of the third transistor; a switch connected to the drains of the third, fourth, fifth and sixth transistors and having two positions, a first position connecting the drains of the third and fourth transistors to a ground and leaving the drains of the fifth and sixth transistors unconnected to the ground, and a second position connecting the drains of the fifth and sixth transistors to the ground and leaving the drains of the third and fourth transistor unconnected to the ground; and a control circuit that measures voltage across the capacitor and causes the switch to change between the two positions to maintain an average value of charge on the capacitor at zero.

DETAILED DESCRIPTION OF THE INVENTION

Figure 1:
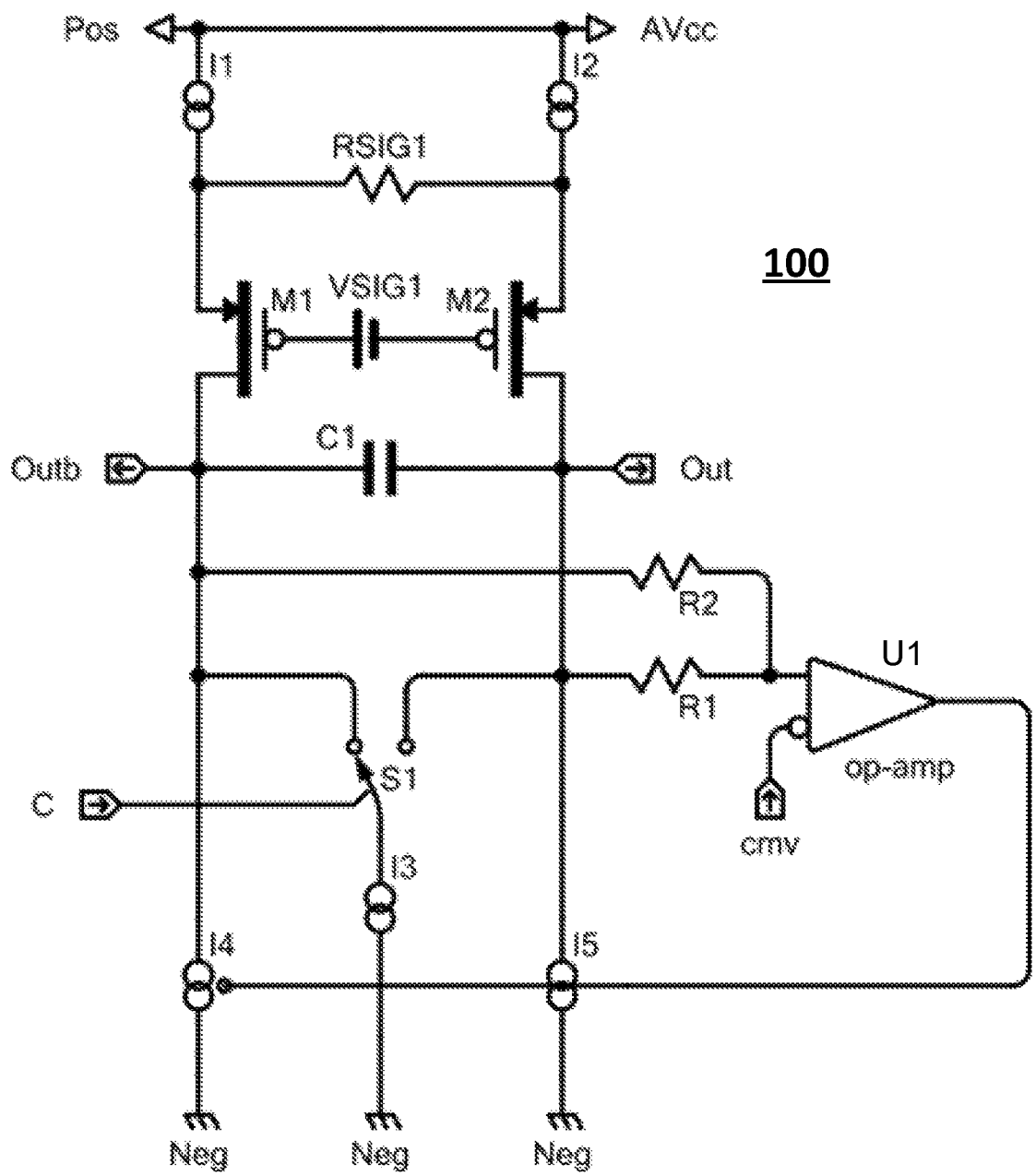
FIG. 1 is a diagram of a ΣΔ modulator as is known in the prior art.

The present application describes an improved ΣΔ modulator, which may function as an ADC. In one embodiment, the ΣΔ modulator has no common mode control loop, and no reference current. This results in decreased complexity, i.e., fewer components, as well as reduced noise.

As explained above, FIG. 1 shows an example of a ΣΔ modulator circuit 100 of the prior art, in which an input difference current is made to flow in the drains of transistors M1 and M2. This occurs because a portion of the nominally equal currents of the current sources I1 and I2 flows through the resistor RSIG1 due to the input voltage VSIG1, which is applied to the gates of transistors M1 and M2.

This configuration of the upper portion of circuit 100, with current sources I1 and I2, transistors M1 and M2, resistor RSIG1 and an input voltage source VSIG1, is well known to those of skill in the art, and makes what is commonly called a voltage-to-current (V to I) convertor. The V to I convertor converts the input voltage VSIG1 to an input difference current $I_{in}$ which flows from the drains of transistors M1 and M2 to the lower portion of circuit 100. (In some applications, an input current source applied between M1 and M2 source terminals may replace the input voltage source VSIG1.)

The input difference current $I_{in}$ flows into current sources I4 and I5, which are also nominally equal currents. Thus, if not for the presence of reference current source I3 and switch S1, this input difference current $I_{in}$ could not pass through the equal current sources I4 and I5, and would thus accumulate on capacitor C1.

However, the presence of reference current source I3 and switch S1 causes the current of I3 to be added to that of either current source I4 or I5, and thus a different amount of current to appear at the drains of transistors M1 and M2. This difference thus adds or subtracts from the input difference current $I_{in}$, and thus alters the voltage across capacitor C1.

A control loop (not shown) inspects the voltage across capacitor C1 by examining the voltage difference between the outputs Out and Outb. The control loop then drives switch S1 to change its position as needed to ensure that the average input difference current $I_{in}$ is equal to the I3 current as modified by the switch S1, i.e, the I3 current times the difference in the time switch S1 spends in its two states.

In addition to this, the "common mode current" must be balanced; that is, the sum of the currents through the drains of M1 and M2 must equal the sum of the currents through sources I3, I4 and I5. If this is not the case, the voltages on the left and right sides of capacitor C1 will move toward the power potential or ground, respectively. The voltage on the left and right side of capacitor C1 is the common mode voltage, while the average voltage accumulated across the capacitor is the normal mode voltage. It is the normal mode voltage that is inspected by the control loop and changes switch S1. In the prior art there must also be a common mode voltage control loop, which keeps the voltage from going too high or too low.

FIG. 1 includes one example of a common mode voltage control loop. One input of amplifier U1 is the voltage at the center tap of resistors R1 and R2, and the other input is a voltage CMV. Amplifier U1 sums the voltages across resistors R1 and R2, and adjusts the currents I4 and I5 to maintain the common mode voltage at the value CMV.

Figure 2:
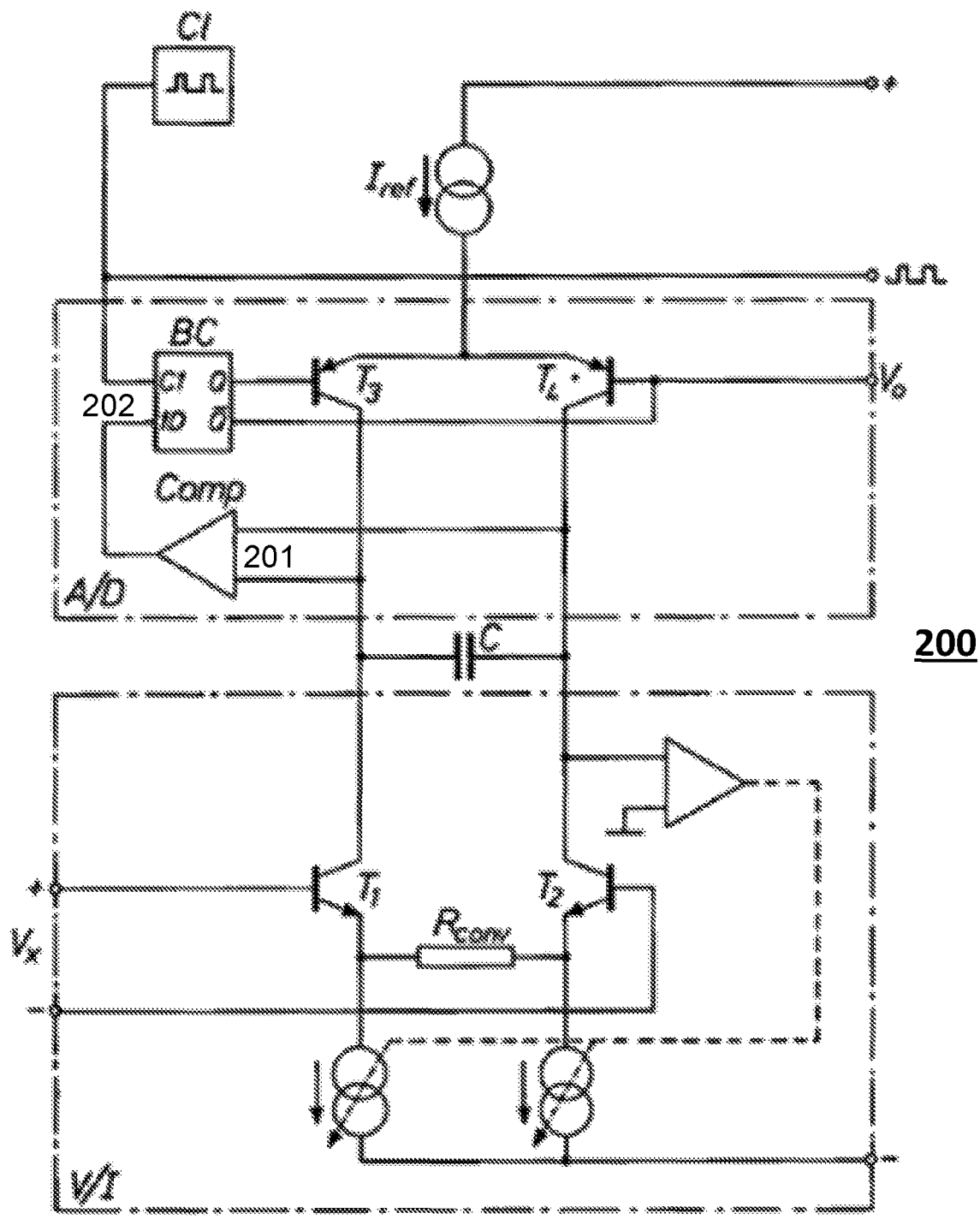
FIG. 2 is a diagram of another ΣΔ modulator as is known in the prior art.

Another example of this type of prior art sigma delta modulator is circuit 200 of FIG. 2, which is a single-bit, first order ΣΔ modulator used in the PM 2517 automatic digital multimeter from Philips; see Philips Technical Manual, vol 38, 1978/79, No. 7/8 at p. 187. Again, a common mode loop is used, with the current difference between transistors T1 and T2 balanced against the current from transistors T3 and T4. The current goes down one side or the other of circuit 200; the voltage on the right side is constant, while the voltage on the left side can vary up and down. A quantized signal is fed back on both the left and right sides.

In circuit 200, transistors T1 and T2 each receive nominally equal currents (from the current sources below them). The common mode control is achieved by modifying the currents flowing through transistors T1 and T2 based upon the input signal across resistor Rconv. The current through transistor T1 thus differs from the current through transistor T2, and the output of comparator 201 is fed to a flip-flop 202, which functions to apply voltage to the gates of transistors T3 and T4, causing transistors T3 and T4 to switch the Iref current to compensate for this difference.

Another issue in the prior art circuits of FIGS. 1 and 2 is the presence of noise. As above, whenever a circuit operates by nulling out the difference of two quantities, which can be seen to be the case in the prior art circuits 100 and 200 of FIGS. 1 and 2, only the nominal value of the quantities are caused to be equal. Thus, if the quantities have an associated noise, the associated noise is not canceled; rather, it remains in the difference between the two quantities as the root-sum-square of the individual noises.

For example, to get an average value of zero, a sequence of values might be generated such as:

1 −1 1 −1 while to get an average value of one, a sequence might be:

1 1 1 1 and an average value of 0.5 might be represented by:

1 1 −1 1 1 1 −1

However, the values of 1 and −1 might have noise, so that instead of these desired values the actual values might be, for example, 0.9 and −0.95.

In circuit 200 of FIG. 2 the noise present in the signal Iref adds to the noise of the two adjustable current sources in the V to I converter block. The common mode circuit causes the absolute value of Iref to match the sum of the two adjustable currents, but it does not reduce the noise. Similarly, in circuit 100 of FIG. 1 the noise present in current source I3 adds noise to the noise of the adjustable current sources I4 and I5.

Figure 3:
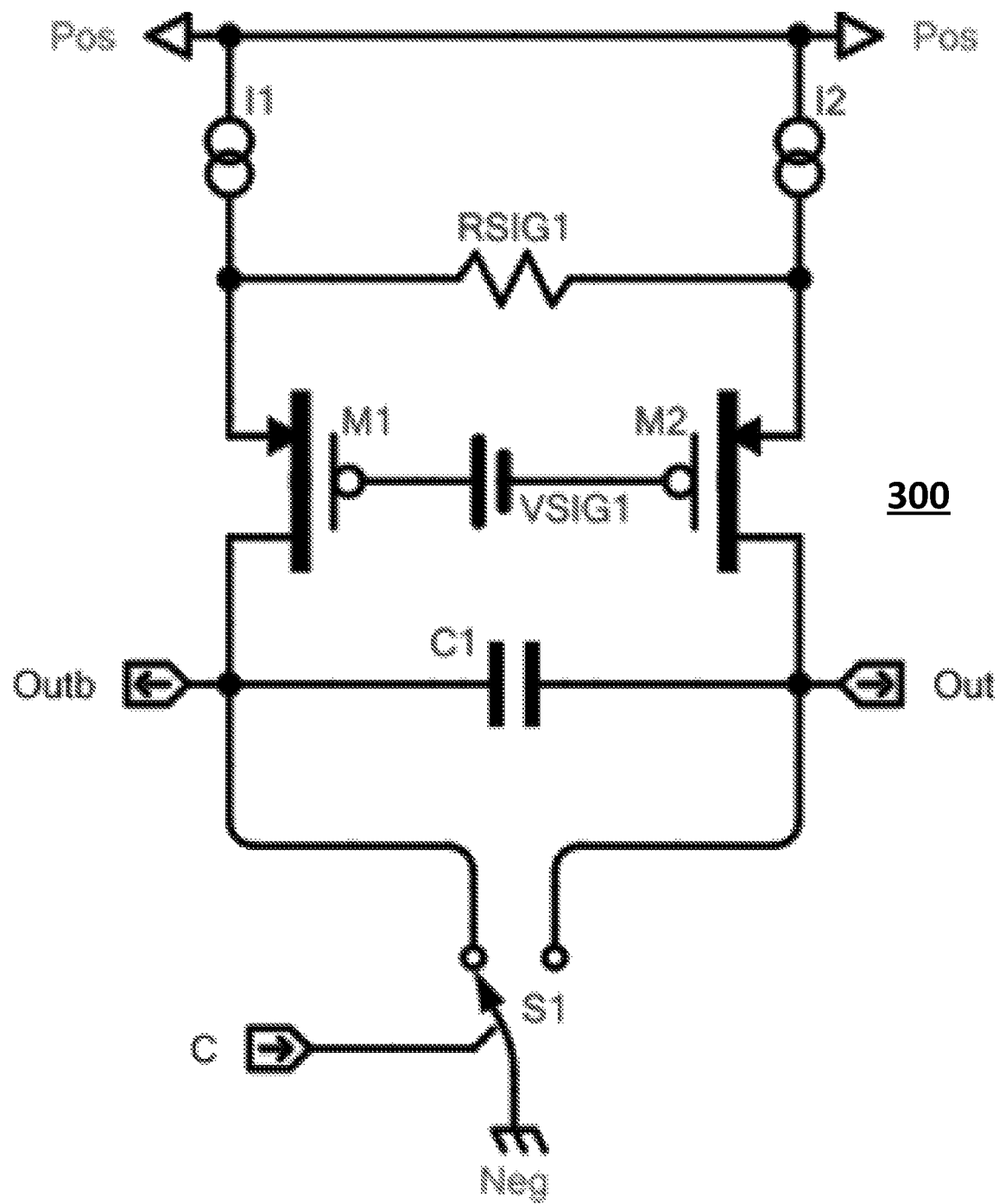
FIG. 3 is a diagram of a ΣΔ modulator without a common mode control loop according to one embodiment.

FIG. 3 shows a ΣΔ modulator circuit 300 according to one embodiment. As with circuit 100 of FIG. 1, the upper portion of circuit 300 contains current sources I1 and I2, transistors M1 and M2, resistor RSIG1 and an input voltage source VSIG1, which again comprise a V to I convertor.

The input difference current $I_{in}$ between the currents from the drains of transistors M1 and M2 in circuit 300 is created in the same way as in circuit 100, and the action of switch S1 is similarly controlled by a control circuit (not shown). However, in circuit 300 there is no balancing current, i.e., the current sources I4 and I5 of circuit 100 are not present in circuit 300. The feedback current of current source I3 of circuit 100 is also not present in circuit 300. Instead, switch S1 forces one side or the other of circuit 300 to ground, and disconnects the other side, leaving it at the common mode voltage as the current on that side has nowhere to go but into capacitor C1.

Without the feedback current I3 of circuit 100, or the reference current Iref of circuit 200, there appears to be no reference in FIG. 3. Rather than comparing the input signal to a reference current, the input signal is compared to the maximum possible signal. That is, when all of the input current goes across RSIG1 in one direction or the other, this acts as a reference.

In spite of the absence of the reference or feedback current, circuit 300 still operates to provide quantized feedback. This may be seen by comparing the effect of circuit 300 to that of circuit 100.

In circuit 100 of FIG. 1 it may be seen that capacitor C1 will charge with a current equal to the difference current $I_{in}$ plus or minus the current I3 (i.e., either $I_{in}+I3$ or $I_{in}-I3$) depending upon the state of switch S1, again assuming that the currents I1, I2, I3 and I4 are all equal.

In circuit 300 of FIG. 3, again current sources I3, I4 and I5 are not present. In this case, capacitor C1 will charge with a current of either $I_{in}+I1$ or $I_{in}-I2$, again depending upon the state of switch S1; the voltages on either side of capacitor C1 are compared and used to control switch S1 via control signal C to keep the average value across capacitor C1 equal to zero. Since it is assumed that the currents of I1 and I2 are equal, the role of current source I3 has been replaced by these current sources, which now act as the reference current.

Thus, in both circuit 100 and circuit 300 the control loop feedback of switch S1 will maintain the average value of charge on the capacitor at zero, and in both circuits 100 and 300 the control loop output is therefore a measure of the input voltage in the usual way of operation of ΣΔ modulators. However, the embodiment of circuit 300 removes the need for most of the components of the common mode feedback circuit of circuit 100, i.e., resistors R1 and R2, amplifier U1, and current sources I3, I4 and I5, while providing a normal mode voltage across capacitor C1 that is what is expected.

As above, in circuit 200 of FIG. 2 and circuit 100 of FIG. 1 the noise present in the signal Iref or I3, respectively, adds to the noise of the two adjustable current sources. The common mode feedback circuit causes the absolute value of Iref to match the sum of the two adjustable currents in circuit 200, and the sum of the currents of I1 and I2 to match the sum of the currents of I3, I4 and I5 in circuit 100, but it does not reduce the noise. By contrast, in the embodiment of circuit 300 of FIG. 3, noise is reduced because there is no reference current. The only noise is that of the currents I1 and I2. Thus, the present embodiment removes components from the circuit, as no common mode control is needed, and also reduces the noise in the circuit.

As above, the normal mode voltage across capacitor C1 in circuit 300 of FIG. 3 is what is expected. However, in some instances, the voltage on each side of C1 may have an odd waveform with discontinuities as the voltage ramps either up to the common mode voltage or down to ground.

Figure 4:
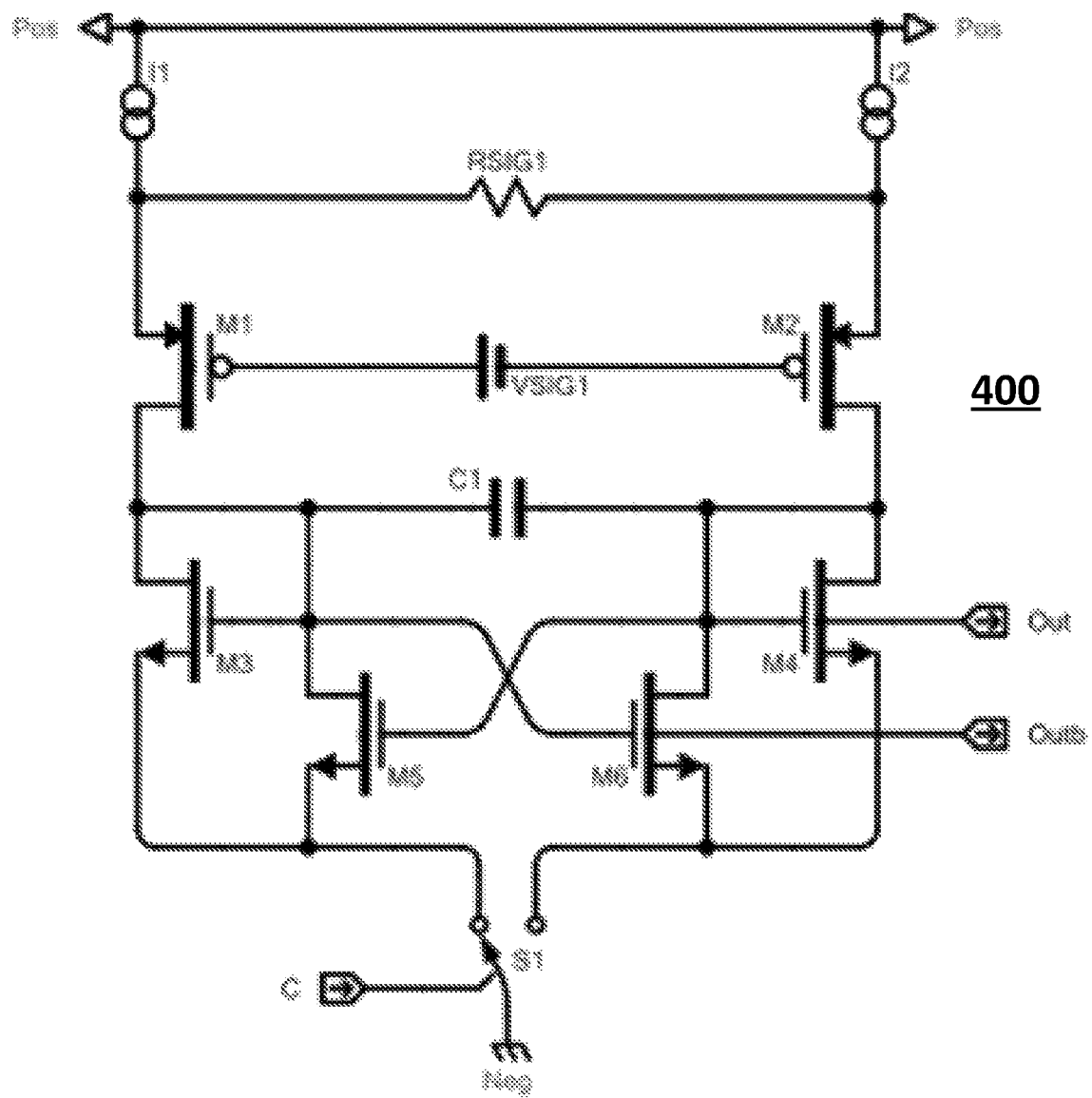
FIG. 4 is a diagram of a ΣΔ modulator without a common mode control loop according to another embodiment.

FIG. 4 illustrates another embodiment in which additional components may be added to circuit 300 to avoid these discontinuities while preserving two of the advantages of circuit 300, i.e., the lack of common mode control and the reduction of noise. In circuit 400, transistors M3, M4, M5 and M6 are added to the configuration of circuit 300 such that the input difference current $I_{in}$ no longer flows directly to ground through switch S1 when it is not flowing onto capacitor C1, but rather flows through certain of the transistors.

Thus, the voltage on each side of capacitor C1 no longer goes to ground when switch S1 is in the appropriate position, but rather to the gate voltage of the transistors M3 to M6 operating at the current level of the I1 and I2 sources.

With switch S1 in the position shown in FIG. 4, the current from transistor M2 cannot flow into transistors M4 or M6 because their sources are disconnected. Nor can that current go into the gate of transistor M5. Thus, all of the current from M2 must flow into capacitor C1, just as in circuit 300 of FIG. 3.

Transistor M3 is diode-connected, i.e., its gate and drain are connected. Its threshold voltage is thus that of transistor M6. When switch S1 changes position, all of the current from transistor M2 will be pulled to transistor M6 and thus to ground, but the voltage on the right side of capacitor C1 will go to the threshold voltage rather than to ground while the voltage on capacitor C1 will remain at the normal mode voltage.

Circuit 400 is another example of how, in the current embodiment, the input difference current $I_{in}$ is connected either to a low impedance (to ground in these examples) or allowed to flow in the capacitor. The noise in the circuit is kept low as long as all of the current is switched in this way. If the current is not all directed to the low impedance node or allowed to charge the capacitor, there will be additional noise due to the partitioning of the current into two parts.

For example, if the circuit were constructed to allow alternately 80% of the current to flow to the capacitor and 20% of the current to flow to ground, followed by 20% of the current to the capacitor and 80% to ground, then additional noise would be present due to the means to perform the partitioning of the current into the 80% and 20% portions. This emphasizes that the current embodiment is characterized by, first, the absence of a separate reference source and, second, by the fact that 100% of the current is directed to the feedback means.

Figure 5:
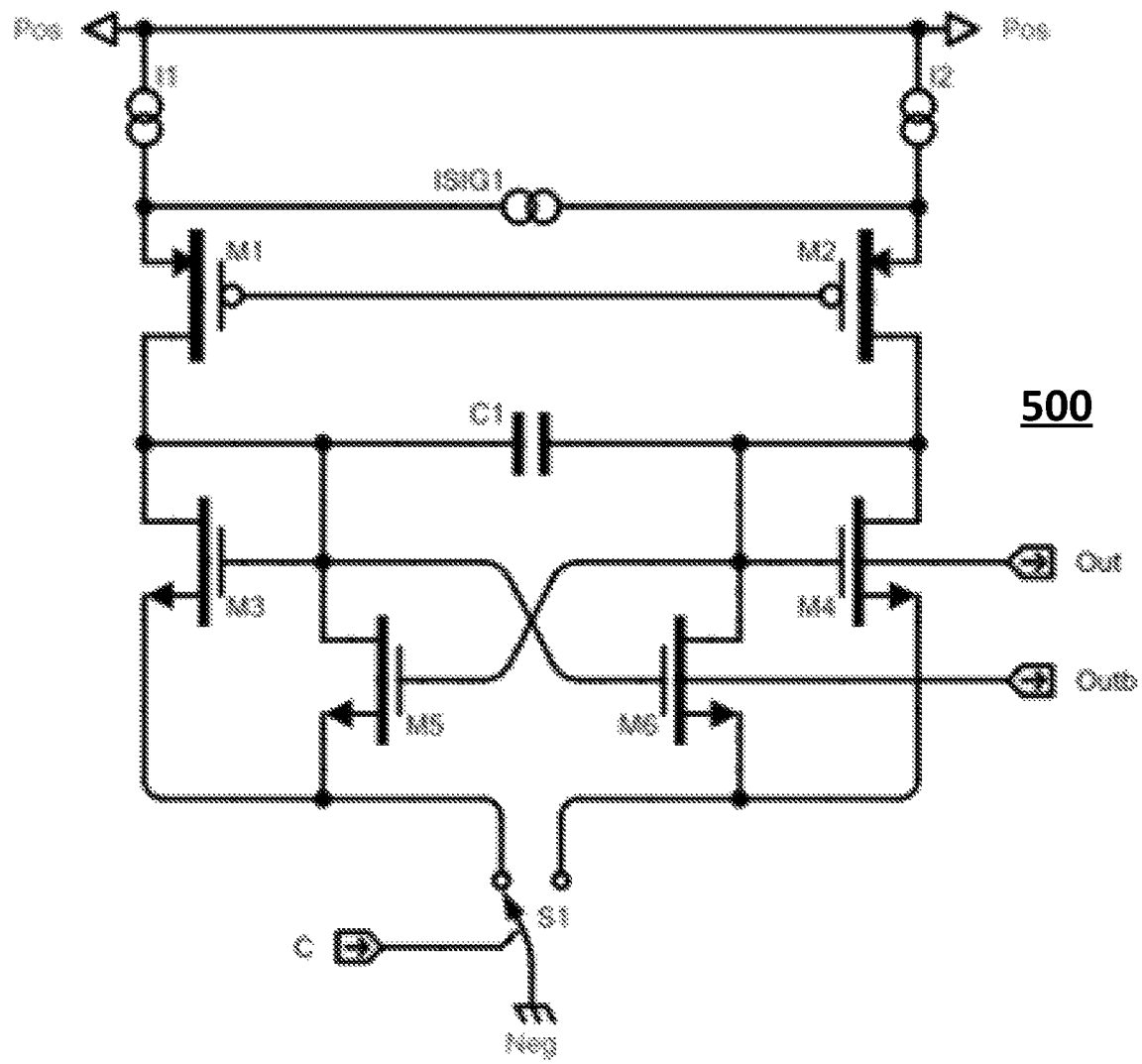
FIG. 5 is a diagram of a ΣΔ modulator without a common mode control loop according to yet another embodiment.

FIG. 5 illustrates an alternative embodiment to that of FIG. 4, in which input voltage source VSIG1 is replaced by an input current source ISIG1. In the embodiments of FIGS. 3 and 4, the input difference current $I_{in}$ is generated by the well-known prior art V to I convertor as in the prior art of FIGS. 1 and 2. Since the input difference current $I_{in}$ is simply the difference between the currents from the drains of the transistors M1 and M2, the input difference current $I_{in}$ may be generated from an input current source ISIG1 between the devices of the V to I as shown in circuit 500 of FIG. 5, rather than from an input voltage source. Similarly, input voltage source VSIG1 in circuit 300 of FIG. 3 could be replaced by an input current source.

By combining these features, it is possible to construct a ΣΔ modulator that reduces both the number of components and the amount of noise present. One of skill in the art will appreciate that a ΣΔ modulator of any order may be constructed according to these principles.

The disclosed system has been explained above with reference to several embodiments. Other embodiments will be apparent to those skilled in the art in light of this disclosure. Certain aspects of the described method and apparatus may readily be implemented using configurations other than those described in the embodiments above, or in conjunction with elements other than or in addition to those described above.

For example, as is well understood by those of skill in the art, various choices will be apparent to those of skill in the art. Further, the illustration of transistors and the associated feedback loops, resistors, etc., is exemplary; one of skill in the art will be able to select the appropriate number of transistors and related elements that is appropriate for a particular application.

These and other variations upon the embodiments are intended to be covered by the present disclosure, which is limited only by the appended claims.

What is claimed is:

1. An apparatus, comprising:
    a voltage to current converter comprising:
        first and second transistors, each transistor having a gate, a source and a drain;
        an input signal source connected between the gates of the first and second transistors and providing an input signal;
        a resistor connected between the sources of the first and second transistors;
        a first current source connected to the source of the first transistor and to a power supply;
        a second current source connected to the source of the second transistor and to a power supply;
        wherein there is a difference between current from the drain of the first transistor and current from the drain of the second transistor, the difference between the currents representing the input signal;
    a capacitor connected between the drain of the first transistor and the drain of the second transistor;
    a switch connected to the drains of the first and second transistors and having two positions, a first position connecting the drain of the first transistor to a ground and leaving the drain of the second transistor unconnected to the ground, and a second position connecting the drain of the second transistor to the ground and leaving the drain of the first transistor unconnected to the ground; and
    a control circuit that measures voltage across the capacitor and causes the switch to change between the two positions to maintain an average value of charge on the capacitor at zero.

2. The apparatus of claim 1 wherein the input signal source is a voltage source.

3. The apparatus of claim 1 wherein the input signal source is a current source.

4. An apparatus, comprising:
    a voltage to current converter comprising:
        first and second transistors, each transistor having a gate, a source and a drain;
        an input signal source connected between the gates of the first and second transistors;
        a resistor connected between the sources of the first and second transistors;
        a first current source connected to the source of the first transistor and to a power supply;
        a second current source connected to the source of the second transistor and to a power supply;
        wherein there is a difference between current from the drain of the first transistor and current from the drain of the second transistor, the difference between the currents representing the input signal;
    a capacitor connected between the drain of the first transistor and the drain of the second transistor;
    a third transistor having a gate, a source and a drain, the source and gate connected to the drain of the first transistor;
    a fourth transistor having a gate, a source and a drain, the source connected to the drain of the first transistor;
    a fifth transistor having a gate, a source and a drain, the source and gate connected to the drain of the second transistor and to the gate of the fourth transistor;
    a sixth transistor having a gate, a source and a drain, the source connected to the drain of the first transistor and to the gate of the third transistor;
    a switch connected to the drains of the third, fourth, fifth and sixth transistors and having two positions, a first position connecting the drains of the third and fourth transistors to a ground and leaving the drains of the fifth and sixth transistors unconnected to the ground, and a second position connecting the drains of the fifth and sixth transistors to the ground and leaving the drains of the third and fourth transistor unconnected to the ground; and
    a control circuit that measures voltage across the capacitor and causes the switch to change between the two positions to maintain an average value of charge on the capacitor at zero.

5. The apparatus of claim 4 wherein the input signal source is a voltage source.

6. The apparatus of claim 4 wherein the input signal source is a current source.

* * * * *

UNITED STATES PATENT AND TRADEMARK OFFICE
CERTIFICATE OF CORRECTION

PATENT NO. : 10,637,496 B2
APPLICATION NO. : 16/454010
DATED : April 28, 2020
INVENTOR(S) : A. Martin Mallinson It is certified that error appears in the above-identified patent and that said Letters Patent is hereby corrected as shown below:

In the Claims

Claim 4:

Column 8, Lines 23 - 25, replace "the source and gate connected to the drain of the first transistor" with --the drain and gate connected to the drain of the first transistor--.

Column 8, Lines 26 - 27, replace "the source connected to the drain of the first transistor" with --the drain connected to the drain of the first transistor--.

Column 8, Lines 28 - 30, replace "the source and gate connected to the drain of the second transistor" with --the drain and gate connected to the drain of the second transistor--.

Column 8, Lines 31 - 33, replace "the source connected to the drain of the first transistor and to the gate of the third transistor" with --the drain connected to the drain and gate of the second transistor and the gate connected to the gate of the third transistor--.

Column 8, Lines 34 - 35, replace "the drains of the third, fourth, fifth and sixth transistors" with --the sources of the third, fourth, fifth and sixth transistors--.

Column 8, Lines 36 - 38, replace "connecting the drains of the third and fourth transistors to a ground and leaving the drains of the fifth and sixth transistors unconnected" with --connecting the sources of the third and fourth transistors to a ground and leaving the sources of the fifth and sixth transistors unconnected--.

Column 8, Line 39 - 41, replace "connecting the drains of the fifth and sixth transistors to a ground and leaving the drains of the third and fourth transistors unconnected" with --connecting the sources of the fifth and sixth transistors to a ground and leaving the sources of the third and fourth transistors unconnected--.

Signed and Sealed this
Eighth Day of December, 2020

Andrei Iancu
*Director of the United States Patent and Trademark Office*